US006835506B2

(12) United States Patent
Griesinger

(10) Patent No.: US 6,835,506 B2
(45) Date of Patent: Dec. 28, 2004

(54) METHOD FOR PRODUCING A PHOTOMASK AND CORRESPONDING PHOTOMASK

(75) Inventor: Uwe Griesinger, Anzing (DE)

(73) Assignee: Infineon Technologies AG, Munich (DE)

( * ) Notice: Subject to any disclaimer, the term of this patent is extended or adjusted under 35 U.S.C. 154(b) by 177 days.

(21) Appl. No.: 10/199,193

(22) Filed: Jul. 19, 2002

(65) Prior Publication Data

US 2003/0036005 A1 Feb. 20, 2003

(30) Foreign Application Priority Data

Aug. 17, 2001 (DE) .......................................... 101 40 354

(51) Int. Cl.[7] .............................................. G03F 9/00
(52) U.S. Cl. ........................................................ 430/5
(58) Field of Search ............................... 430/5, 30, 22

(56) References Cited

U.S. PATENT DOCUMENTS 4,816,361 A * 3/1989 Glendinning .................. 430/5

* cited by examiner

Primary Examiner—Saleha R. Mohamedulla
(74) Attorney, Agent, or Firm—Welsh & Katz, Ltd.

(57) ABSTRACT

The present invention provides a method for producing a photomask (1), which has the following steps: provision of a mask blank with a substrate (1a) and a masking layer (1b) applied thereto; whole-area resist-coating of the mask blank with a photoresist; performance of a raster scan exposure of the photoresist in accordance with a predetermined photomask pattern in a pattern region (MB), which is separated from an edge (1c) of the mask blank by a peripheral edge region (RB); performance of the raster scan exposure in at least one peripheral partial region of the edge region (RB), which adjoins the edge (1c) on one side; development of the exposed photoresist; etching of the masking layer (1b); and removal of the photoresist. The present invention also provides a corresponding photomask.

8 Claims, 3 Drawing Sheets

METHOD FOR PRODUCING A PHOTOMASK AND CORRESPONDING PHOTOMASK

The present invention relates to a method for producing a photomask and a corresponding photomask.

Although applicable, in principle, to any desired photomasks, the present invention and the problem area on which it is based are described with reference to a photomask for producing a semiconductor structure.

Photomasks are usually produced from photomask blanks, the blanks having a square quartz substrate that is coated with a chromium layer over the whole area by vapor deposition. For the patterning of the chromium layer on the photomask blank, use is made of the photolithographic technique in order to remove the chromium in regions in accordance with a predetermined photomask pattern. Depending on the mask type, one or more photo-steps are required; in the case of phase masks, for example, two photo-steps are usually carried out.

Figure 3:
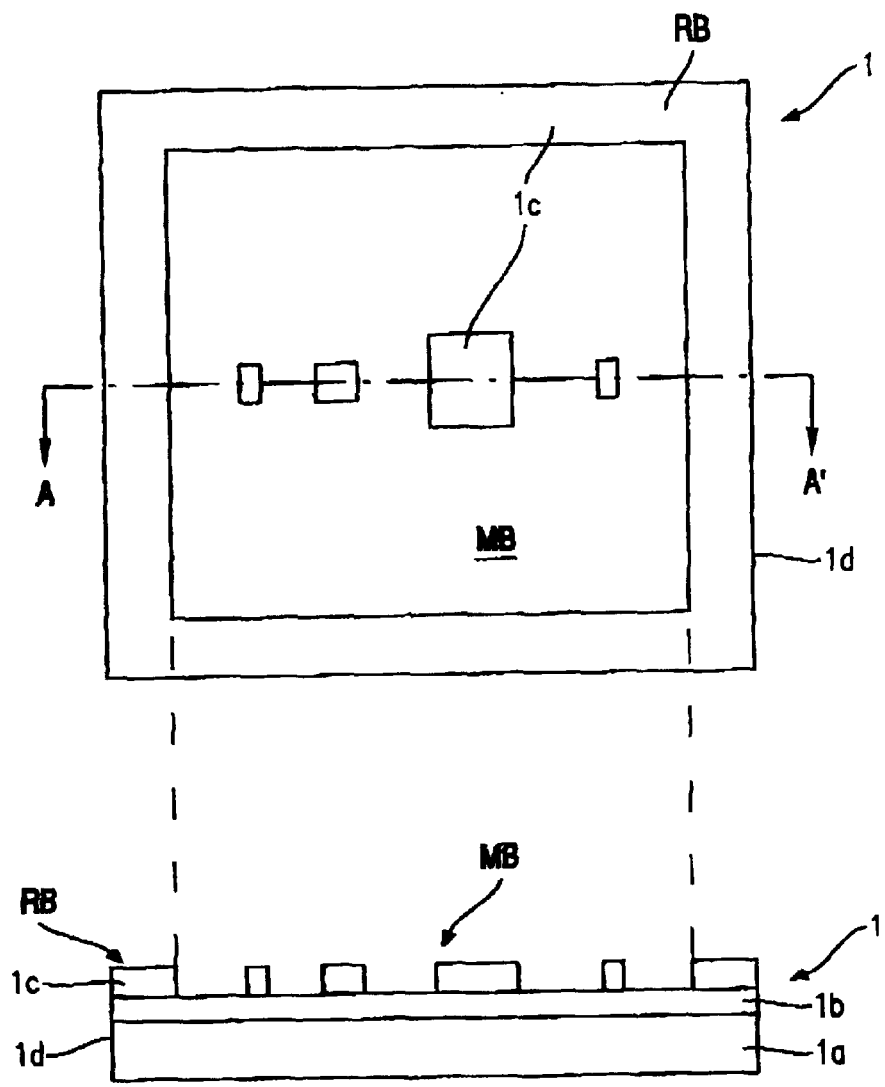

FIG. 3 shows a diagrammatic representation for illustrating the problem area in the case of the prior art.

Figure 2:
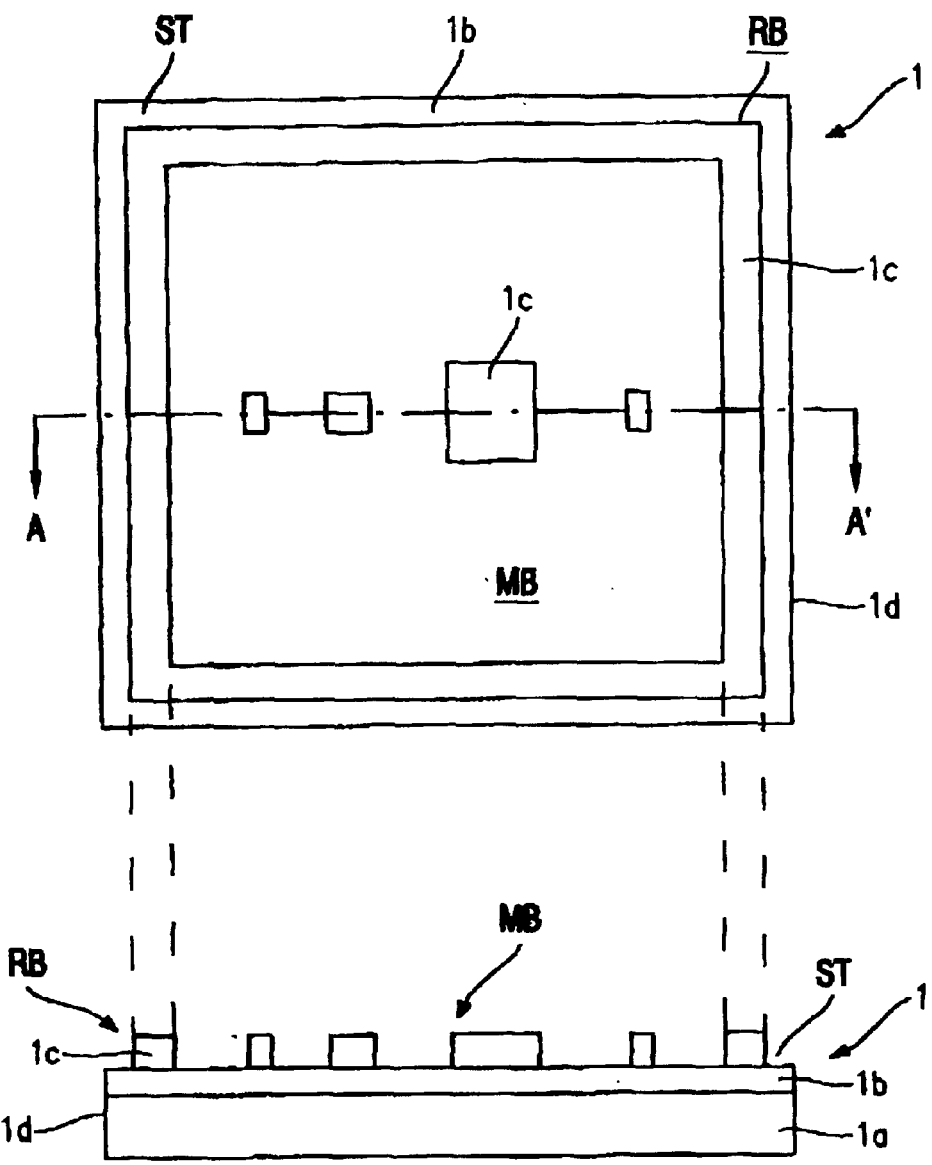

In FIG. 2, reference symbol 1 generally designates a photomask which is represented in plan view in the upper part of FIG. 2 and in cross section along the line A–A' in the lower part of FIG. 2.

In its central region, the photomask 1 has a pattern region MB of approximately disk-shaped configuration (side length corresponding to the radius of a wafer to be exposed). The pattern region MB is surrounded by an edge region RB, which has no significance for the function of the photomask. This edge region RB extends from the outer edge of the pattern region MB as far as the edge 1d of the photomask 1.

As already mentioned, the photomask blank comprises the quartz substrate 1a and a chromium layer 1b vapor-deposited thereon over the whole area. Photoresist 1c is then applied to said photomask blank over the whole area and exposed by means of a raster scan exposure, that is to say by means of a laser beam which is moved in a raster-type manner and is switched on and off in accordance with the photomask pattern.

In the case of the customary method, the exposure of the photoresist 1c by the raster scan method occurs only at corresponding locations in the pattern region MB, whereas the entire edge region RB is not exposed. The consequence of this, as shown in the lower part of FIG. 3, is that, after the development of the photoresist 1c, the photoresist remains on the entire edge region RB.

However, the photoresist 1c at the edge of the photomask blanks is regularly the cause of defects of mask production, since mechanical grippers which transport the photomask blank damage said resist and thereby partly strip it off, so that it is deposited again at another location on the photomask blank. This last may, for example, have the consequence that resist residues are deposited at already developed locations of the photoresist where the chromium layer 1b should actually be etched. This is prevented, however, in an undesirable manner, by such resist residues.

The customary edge resist-removing methods from semiconductor technology cannot be employed on account of the square geometry of the photomask blanks. Especially in the case of phase masks, which require two successive photo-steps with two successive resist-coating processes, exposures, developments, etchings and resist-removal processes, resist residues in the edge region are problematic since defects can occur very late in the process conclusion and are often no longer repairable.

To date, the yield has been greatly reduced by the problem described above.

Therefore, it is an object of the present invention to provide an improved method for producing a photomask and a corresponding photomask, edge resist problems being able to be avoided.

According to the invention, this object is achieved by means of the method specified in claim 1 and the corresponding photomask according to claim 5.

The idea underlying the present invention consists in forming the raster scan exposure in at least one peripheral partial region of the edge region, which adjoins the edge on one side or overlaps said edge.

Compared with the known solution approaches, the method according to the invention has the advantage that resist removal takes place in the partial region of the edge region which adjoins the edge on one side, is performed [sic], so that no defects occur in the later process flow as a result of resist particles.

Advantageous developments and improvements of the respective subject matter of the invention are found in the subclaims.

In accordance with one preferred development, the raster scan exposure is carried out in the entire edge region.

In accordance with a further preferred development, the substrate is a quartz plate and the masking layer applied thereto is a chromium layer.

In accordance with a further preferred development, the photomask is a phase mask which is patterned by means of a first and a second photoresist step, and the performance of the raster scan exposure in at least one peripheral partial region of the edge region is carried out in the second photo-step.

An exemplary embodiment of the present invention is illustrated in the drawings and is explained in more detail in the description below.

Figure 1:
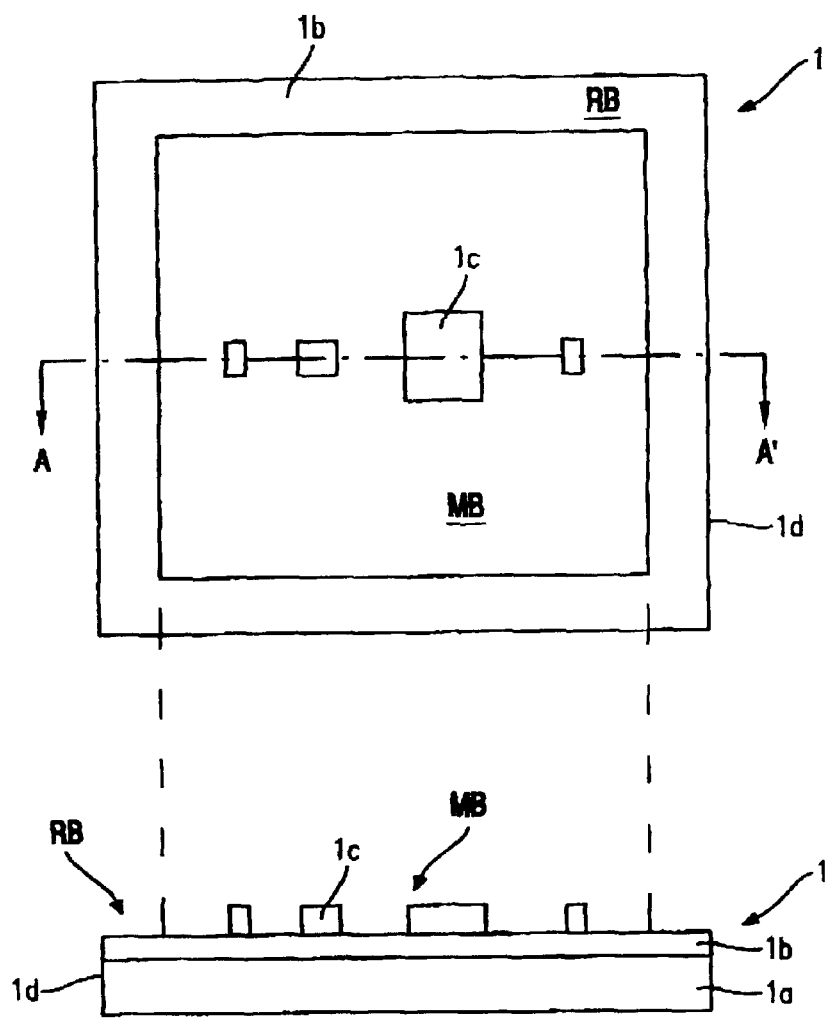

In the figures:

FIG. 1 shows a photomask which has been produced in accordance with a first embodiment of the method according to the invention; and FIG. 2 shows a photomask which has been produced in accordance with a second embodiment of the method according to the invention; and FIG. 3 shows a diagrammatic representation for illustrating the problem area in the case of the prior art.

In the figures, identical reference symbols designate identical or functionally identical elements.

FIG. 1 shows a photomask which has been produced in accordance with a first embodiment of the method according to the invention.

In accordance with the embodiment shown in FIG. 1, in principle the same steps are carried out as in the case of the customary prior art which was explained above with reference to FIG. 2, although with an essential difference with regard to the exposure of the edge region RB by the raster scan method.

Specifically, during the exposure of the photoresist 1c applied to the chromium layer 1b, not only is the pattern region MB exposed in accordance with the photomask pattern, but a special pattern is also applied to the edge region RB, which pattern provides for the photoresist 1c to be removed in at least one peripheral partial region of the edge region, which adjoins the edge 1d of the photomask on one side.

In the case of the first embodiment shown in FIG. 1, said partial region corresponds to the entire edge region RB In other words, the photoresist 1c is removed in the entire edge region by corresponding raster scan exposure and development in accordance with this first embodiment.

FIG. 2 shows a photomask which has been produced in accordance with a second embodiment of the method according to the invention In the case of the embodiment shown in FIG. 3, the photoresist 1c is removed only in a specific edge strip ST—running at the edge 1c—of the edge region RB, whose width is chosen precisely such that mechanical gripping devices cannot lift off any resist during transport of the partially processed photomask blank.

Although the present invention has been described above using preferred exemplary embodiments, it is not restricted thereto, but rather can be modified in diverse ways.

In a further further [sic] embodiment that is not specifically illustrated here, the photomask is a phase mask, which requires two successive photo-steps. In this connection, the illustration of FIG. 1 or 2 corresponds to the second of two successive photo-steps, in which the edge resist removal according to the invention is carried out by edge exposure and what is thus achieved is that the edge regions of the resist are removed by the subsequent development process and can no longer serve as a defect source.

What is claimed is:

1. Method for producing a photomask, which has the following steps:
   provision of a mask blank with a substrate and a masking layer applied thereto;
   whole-area resist-coating of the mask blank with a photoresist;
   performance of a raster scan exposure of the photoresist in accordance with a predetermined photomask pattern in a pattern region, which is separated from an edge of the mask blank by a peripheral partial region of the edge region, which adjoins the edge on one side;
   development of the exposed photoresist;
   etching of the masking layer; and
   removal of the photoresist.

2. Method according to claim 1, characterized in that the raster scan exposure is carried out in the entire edge region.

3. Method according to claim 1, characterized in that the substrate is a quartz plate and the masking layer applied thereto is a chromium layer.

4. Method according to claim 1, characterized in that the photomask is a phase mask which is patterned by means of a first and a second photoresist step, and the performance of the raster scan exposure in at least on peripheral partial region of the edge region is carried out in the second photo-step.

5. Photomask having;
   a substrate and a masking layer applied thereto;
   a pattern region of the masking layer, which is separated from an edge of the substrate by a peripheral edge region;
   a peripheral partial region of the edge region, which adjoins the edge on one side and has no masking layer.

6. Photomask according to claim 5, characterized in that the partial region corresponds to the entire edge region.

7. Photomask according to claim 5, characterized in that the substrate is a quartz plate and the masking layer applied thereto is a chromium layer.

8. Photomask according to claim 5, characterized in that it is a phase mask.

* * * * *